United States Patent
Csoka et al.

(10) Patent No.: US 10,566,967 B2
(45) Date of Patent: Feb. 18, 2020

(54) CIRCUIT ARRANGEMENT FOR DRIVING AN INDUCTIVE LOAD

(71) Applicant: CONTINENTAL AUTOMOTIVE GMBH, Hannover (DE)

(72) Inventors: Zoltan Csoka, Dumbravita (RO); Octavian Luca, Timisoara (RO)

(73) Assignee: Continental Automotive GmbH, Hannover (DE)

( * ) Notice: Subject to any disclaimer, the term of this patent is extended or adjusted under 35 U.S.C. 154(b) by 0 days.

(21) Appl. No.: 16/315,180

(22) PCT Filed: Jul. 13, 2017

(86) PCT No.: PCT/EP2017/067786
§ 371 (c)(1),
(2) Date: Jan. 4, 2019

(87) PCT Pub. No.: WO2018/015282
PCT Pub. Date: Jan. 25, 2018

(65) Prior Publication Data
US 2019/0229719 A1    Jul. 25, 2019

(30) Foreign Application Priority Data

Jul. 18, 2016  (EP) .................................... 16465519
Jul. 19, 2016  (DE) ........................ 10 2016 213 200

(51) Int. Cl.
*H03K 17/08* (2006.01)
*H03K 17/082* (2006.01)

(52) U.S. Cl.
CPC .............................. *H03K 17/0822* (2013.01)

(58) Field of Classification Search
CPC ............. H03K 17/08; H03K 17/08104; H03K 17/0822
See application file for complete search history.

(56) References Cited

U.S. PATENT DOCUMENTS 4,658,203 A *  4/1987  Freymuth ............ H03K 17/687
                                                    257/363
5,811,996 A     9/1998  Oyabe et al.
(Continued)

FOREIGN PATENT DOCUMENTS

DE  102007006179 A1  8/2008
DE  102014219048 A1  3/2016
(Continued)

*Primary Examiner* — Hai L Nguyen
(74) *Attorney, Agent, or Firm* — Laurence A. Greenberg; Werner H. Stemer; Ralph E. Locher

(57) ABSTRACT

A circuit arrangement for driving an inductive load is connectable to a load terminal. A first MOS field effect transistor is connected between a terminal for a high potential of a first supply voltage source and the load terminal. A series connection with a freewheeling diode and a second MOS field effect transistor has its freewheeling diode connected between the load terminal and a second terminal for a low potential of the first supply voltage source. The freewheeling diode has its cathode connected to the load terminal. A series connection with a reverse-biased zener diode and a forward-biased diode is connected between the drain and gate terminals of the first MOS field effect transistor. A first control signal terminal is connected to the gate terminal of the second MOS field effect transistor and via an AND circuit to the gate terminal of the first MOS field effect transistor.

9 Claims, 4 Drawing Sheets

(56) References Cited

U.S. PATENT DOCUMENTS

| | | | | |
|---|---|---|---|---|
| 5,939,908 | A | * | 8/1999 | Moore ............... H03K 17/6874 326/21 |
| 6,157,095 | A | * | 12/2000 | Namuduri ............. H01F 7/1883 307/125 |
| 7,948,730 | B2 | | 5/2011 | Oliveira et al. |
| 8,061,333 | B2 | | 11/2011 | Bolz |
| 8,217,686 | B2 | * | 7/2012 | Falter ..................... H03K 17/18 327/110 |
| 2015/0280416 | A1 | | 10/2015 | Kreuter et al. |

FOREIGN PATENT DOCUMENTS

| | | |
|---|---|---|
| EP | 0675598 A2 | 10/1995 |
| JP | 2001110632 A | 4/2001 |

\* cited by examiner

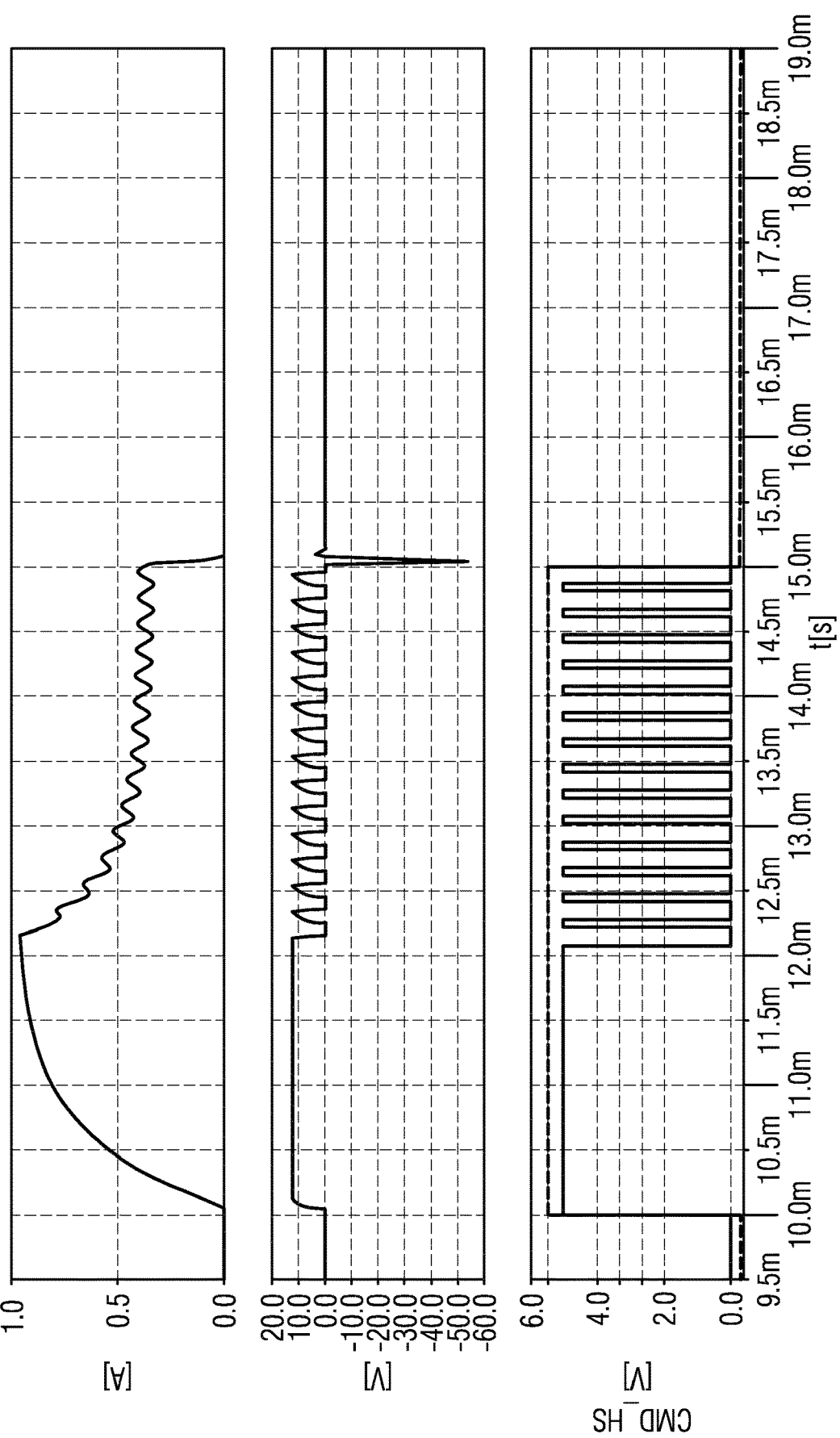

CIRCUIT ARRANGEMENT FOR DRIVING AN INDUCTIVE LOAD

BACKGROUND OF THE INVENTION

Field of the Invention

The invention relates to a circuit arrangement for driving a load connectable to a load terminal, having a first MOS field effect transistor connected up between a first terminal for a high potential of a first supply voltage source and the load terminal and having a freewheeling diode connected up between the load terminal and a second terminal for a low potential of the first supply voltage source, the freewheeling diode having its cathode connected to the load terminal.

Such a circuit arrangement is known from DE 10 2014 219 048 A1. The inductive loads to be driven can be any type of magnetically operated actuators such as, for example, fuel injection valves or motors, as are used diversely in a motor vehicle.

Such circuit arrangements are usually operated, as depicted in FIG. 4 of DE 10 2014 219 048 A1, such that the MOS field effect transistor is closed by means of driving via a control circuit, which can be realized as a microprocessor, for example, as a result of which the inductive load is supplied with current from the supply voltage source via the switch realized by the MOS field effect transistor. The current in this case rises to a first prescribed threshold value, whereupon the field effect transistor is opened again and the magnetic energy stored in the inductive load dissipates as a result of an induced flow of current via the freewheeling diode, until the current reaches a second, lower threshold value, whereupon the field effect transistor is closed again. This is continued periodically, so that this pulsed operation results in a mean flow of current taking place in the inductive load and the resultant holding current keeps the magnetic actuator to be driven in the desired position, for example a fuel injection valve remains open. If the field effect transistor is subsequently turned off, the magnetic field in the inductive load dissipates almost completely by means of a current via the freewheeling diode.

Although a circuit arrangement according to DE 10 2014 219 048 A1 is of relatively simple design with only a few components and has only one connection to the inductive load, the final dissipation of the magnetic energy stored in the inductive load is possible only by means of a flow of current via the freewheeling diode with its low forward voltage, which means that this can take an undesirably long time.

A broadening according to DE 10 2007 006 179 A1 can avoid this problem. In FIG. 3 therein, that terminal of the inductive load that is not connected to the load terminal is connected to the reference-ground potential via a further MOS field effect transistor and additionally to the first terminal for a high potential of the first supply voltage source via a further forward-biased diode. The load terminal is moreover connected to the terminal for a high potential of a second supply voltage source via a reverse-biased diode and a third MOS field effect transistor, the voltage of the second supply voltage source being lower than the voltage of the first supply voltage source by a factor of 2 to 3.

If such a circuit arrangement for driving an inductive load is operated as shown in FIG. 5 of DE 10 2007 006 179 A1, closing of the first and second MOS field effect transistors will initially result in a current from the first supply voltage source flowing through the inductive load, wherein this current rises relatively quickly on account of the high voltage of the first supply voltage source, until it reaches a first threshold value. The first MOS field effect transistor is then closed, whereupon the magnetic field stored in the inductive load begins to dissipate by means of a flow of current via the first diode and the second MOS field effect transistor, until the current reaches a second, lower threshold value, whereupon the third MOS field effect transistor is now turned on, however, and consequently only the distinctly lower voltage of the second supply voltage source is then applied to the inductive load. The current now begins to rise again, until it reaches the first threshold value again, whereupon the third MOS field effect transistor is turned off again.

This process is now continued periodically again, until the inductive load is to be turned off completely, which is effected by opening both the third and the second MOS field effect transistor, whereupon the magnetic energy stored in the inductive load now dissipates as a result of a flow of current via the first and second diodes back to the first supply voltage source, the distinctly higher voltage value of the first supply voltage source meaning that the decrease in current is effected distinctly more quickly, as can also be seen from the slopes of the currents in FIG. 5 of DE 10 2007 006 179 A1.

The price of this advantage, however, is that there are distinctly more components in the circuit arrangement and additionally the inductive load, which in a motor vehicle usually needs to be connected to a controller containing the circuit arrangement by means of appropriate lines, now needs to be connected via two such lines, meaning correspondingly higher complexity. However, it is desirable to avoid additional lines in the wiring harness and power switching elements, which have to carry high currents.

SUMMARY OF THE INVENTION

It is therefore the object of the invention to specify a circuit arrangement for driving an inductive load that requires only one connection to an inductive load and furthermore requires few power switching elements, but is capable of quickly dissipating a magnetic field stored in the inductive load.

The object is achieved by a circuit arrangement as claimed, and advantageous developments are specified in the dependent claims.

The object is achieved by a circuit arrangement of the type in question in which the drain and gate terminals of the first MOS field effect transistor have a series connection comprising at least one reverse-biased zener diode and a forward-biased diode connected up between them and in which a control signal terminal is connected to the gate terminal of the second MOS field effect transistor and via an AND circuit to the gate terminal of the first MOS field effect transistor.

As a result of this measure, the turned-on second MOS field effect transistor means that during the pulsed hold phase the freewheeling diode is used as a current path to demagnetize the inductive load, whereas during the turn-off process the second MOS field effect transistor can be opened, so that the decrease in current is effected by means of the first MOS field effect transistor, which, on account of the voltage induced in the inductive load on account of the turn-off process, produces a current path via the first zener diode and a Miller capacitance of the first MOS field effect transistor that turns on the first MOS field effect transistor again at this high voltage, so that the magnetic field in the inductive load can quickly dissipate.

In an advantageous development of the circuit arrangement according to the invention, the second MOS field effect transistor has a first load path terminal and a second load path terminal, which is connected to the second terminal for the low potential of the first supply voltage source, and also a gate terminal, wherein the first load path terminal and the gate terminal have the load path of a third MOS field effect transistor connected up between them, the first control signal terminal being connected to the gate terminal of the latter via an inverter circuit.

This advantageous connecting-up of the second and third MOS field effect transistors results in the third MOS field effect transistor being turned on when the second MOS field effect transistor is turned off, which means that the second MOS field effect transistor is turned off very quickly and hence the conductive path via the first MOS field effect transistor is set up very quickly, so that the magnetic field stored in the inductive load can quickly dissipate.

In an advantageous form of the circuit arrangement according to the invention, the second and third MOS field effect transistors are in the form of n-MOS field effect transistors that have a respective substrate diode and are connected up such that the substrate diodes are connected up with reverse polarity in relation to the freewheeling diode.

This prevents conductive paths from arising on account of the same polarity of the substrate diodes and the freewheeling diode if the n-MOS field effect transistors were to be connected up in the usual manner.

In a development of the circuit arrangement according to the invention, the first control signal terminal is connected to the gate terminal of the second and third MOS field effect transistors via a first and a second driver circuit, respectively.

This allows logic levels to be used to drive the two MOS field effect transistors and still allows the requisite voltages for these power transistors to be provided.

In an advantageous form of the circuit arrangement according to the invention, the gate terminal of the third MOS field effect transistor is connected to the second terminal for a low potential of the supply voltage source via a first resistor, for the purpose of connecting said second terminal to ground, and to the output of the second driver circuit via a second resistor, for the purpose of current limiting.

In a further advantageous configuration of the circuit arrangement, the output of the second driver circuit is connected to the second terminal for the low potential of the first supply voltage source via a reverse-biased second diode. This serves as protection against negative voltages at the output of the second driver circuit.

Likewise to protect against negative voltages, the gate terminal of the third MOS field effect transistor is connected to the first load terminal of the second MOS field effect transistor via a reverse-biased zener diode.

BRIEF DESCRIPTION OF THE SEVERAL VIEWS OF THE DRAWING

The invention is intended to be explained in more detail below on the basis of an exemplary embodiment with the aid of figures. In the figures here:

FIG. 4 shows current and voltage profiles during a driving process for an inductive actuator.

DESCRIPTION OF THE INVENTION

Figure 1:
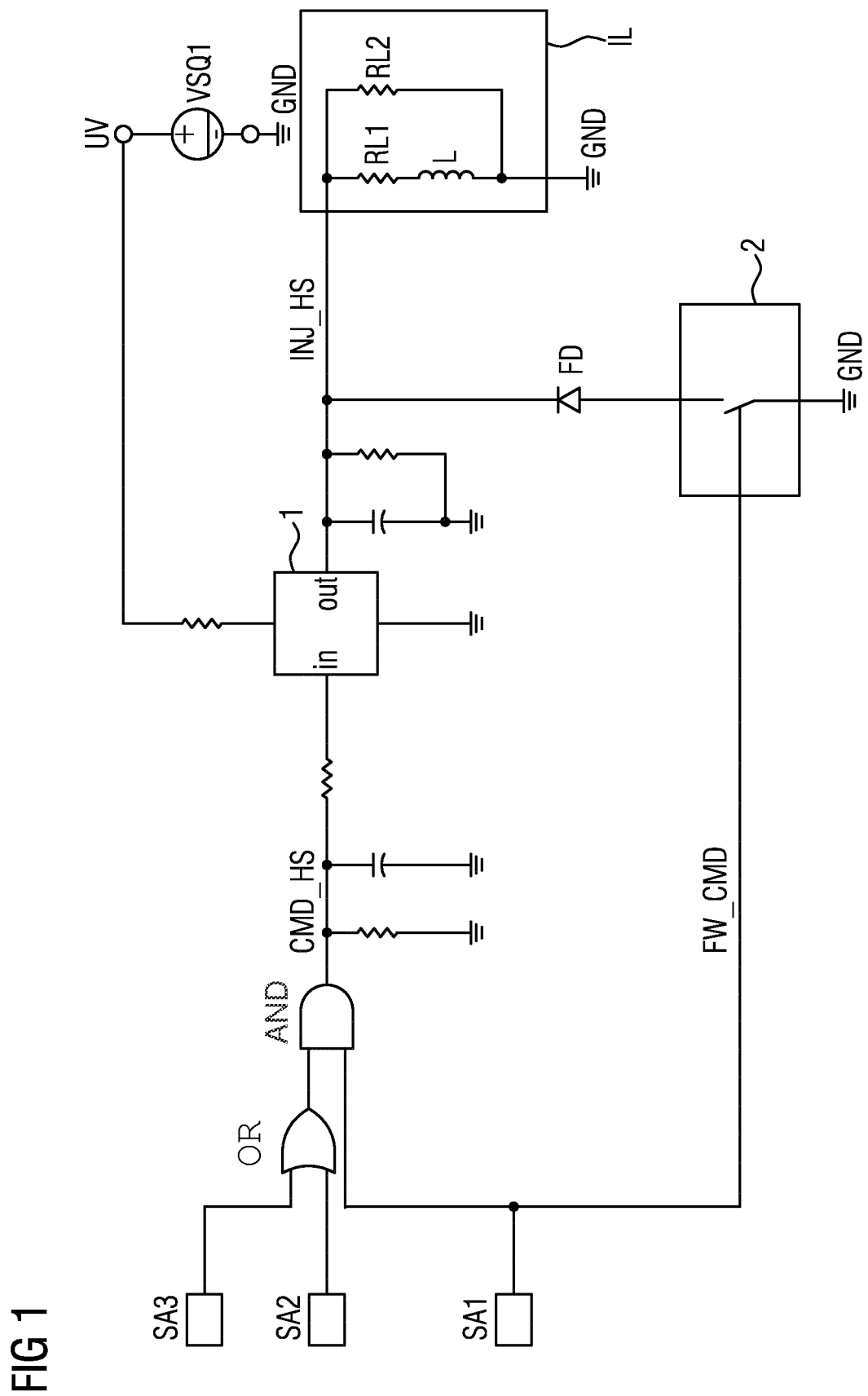
FIG. 1 shows a block diagram of a circuit arrangement according to the invention.
Figure 2:
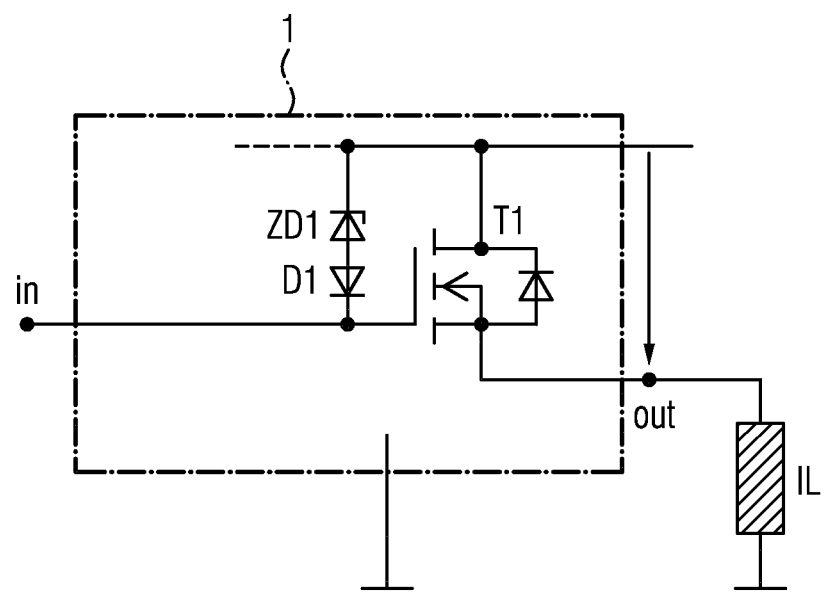
FIG. 2 shows an MOS field effect transistor whose drain terminal is connected to its gate terminal via at least one reverse-biased zener diode.

In the block diagram of FIG. 1, the first terminal UV of a first supply voltage source VSQ1 is connected to a first load terminal of a power switching element 1, which as shown in FIG. 2 is in the form of a first MOS field effect transistor T1. The second load terminal of the first MOS field effect transistor T1 is connected to a node INJ_HS that is secondly connected to the second terminal GND for a low supply voltage potential of the first supply voltage source VSQ1 via a reverse-biased freewheeling diode FD and a second power switching element 2 connected in series therewith. The node INJ_HS additionally has the first terminal of an inductive load IL connected to it, the second terminal of the inductive load IL being connected to the second terminal GND of the first supply voltage source VSQ1.

In the example of FIG. 1, the inductive load IL is depicted with an inductance L, a non-reactive resistance RL1 connected in series therewith and a second resistance RL2 connected in parallel with said series connection as an equivalent circuit diagram.

A first control terminal SA1 is connected firstly to the control terminal of the second power switching element 2 and secondly via an AND gate AND to the control terminal of the first MOS field effect transistor T1. A further input of the AND gate AND has the output of an OR gate OR connected to it, the two inputs of which are connected to a second and a third control terminal SA2, SA3, respectively.

In a manner according to the invention, the first load terminal of the first power switching element 1, which corresponds to the drain terminal of the first MOS field effect transistor T1, and the control terminal of the first power switching element 1, which corresponds to the gate terminal of the first MOS field effect transistor T1, have the series connection comprising a reverse-biased first zener diode ZD1 and a forward-biased first diode D1 connected between them.

The operation of the circuit arrangement as shown in FIG. 1 with a first power switching element 1 as shown in FIG. 2 will be explained in this case on the basis of FIG. 4 by means of the current and voltage profiles depicted therein at particular points in the circuit arrangement.

When the first signal terminal SA1 has a signal at a particular level applied to it—for example a TTL level of 5 volts—this turns on the second power switching element 2. If additionally one of the two further signal terminals SA2 or SA3 has a high level applied to it, the second input of the AND gate AND also has a high level applied to it, so that the signal CMD_HS at the output of the AND gate AND has a high level, as depicted in a first time range in the lower graph in FIG. 4. This likewise turns on the first power switching element 1, which is formed by means of the first MOS field effect transistor T1, so that a current now flows from the first supply voltage source VSQ1 to the inductive load IL via the first power switching element 1, the result being a current profile as shown in the upper graph in FIG. 4 that shows the typical experimentally rising current profile for an inductance.

This current is measured and is compared with a first threshold value, this being effected in a control circuit, not depicted, and arrival at this threshold value results in a LOW level at the signal terminal S2 or S3 previously switched to HIGH likewise switching the signal CMD_HS at the output of the AND gate AND to LOW, as can be seen in the lower graph in FIG. 4.

This turns off the first MOS field effect transistor T1 again, as a result of which the magnetic field built up in the inductive load IL dissipates by virtue of an induced voltage bringing about a flow of current that is effected via the freewheeling diode FD and the second power switching element 2.

In the pulse-modulated mode that now follows, the signal at the control signal input SA2 and SA3 is periodically switched on and off again at equidistant intervals, as can be seen in the lower graph in FIG. 4, resulting in a current profile as depicted in the upper graph in FIG. 4. The middle graph in FIG. 4 depicts the voltage profile at the node INJ_HS.

When the inductive load IL is finally intended to be turned off, the signal at the first control terminal SA1 is switched to LOW, so that the second power switching element 2 opens and the AND gate AND is likewise used to turn off the first power switching element 1. As a result, the inductive load IL, in which a magnetic field is in turn dissipated, means that a negative voltage is built up at the node INJ_HS, said voltage rising until the zener diode ZD1 begins to turn on. The gate of the first MOS field effect transistor T1 is charged by means of the Miller capacitance thereof and consequently the first MOS field effect transistor T1 is turned on again. The voltage at the node INJ_HS is held at the high level required for the zener diode ZD1 to be on, as a result of which the inductive load IL can quickly discharge.

If the zener voltage of the first zener diode ZD1 is 63 volts, for example, the voltage across the first diode D1 connected in series therewith is 0.6 volt, the Miller plateau voltage is 3 volts and the voltage of the first supply voltage source VSQ1 is 12 volts, a necessary voltage for turning back on the first MOS field effect transistor T1 at the node INJ_HS is $$12\ V - 63\ V - 0.6\ V - 3\ V = -54.6\ V,$$

which can be seen in the middle graph in FIG. 4.

It is thus possible to achieve fast dissipation of the magnetic energy stored in the inductive load IL by using just two power switching elements T1, T2 and just one connecting line between them and the inductive load IL.

Figure 3:
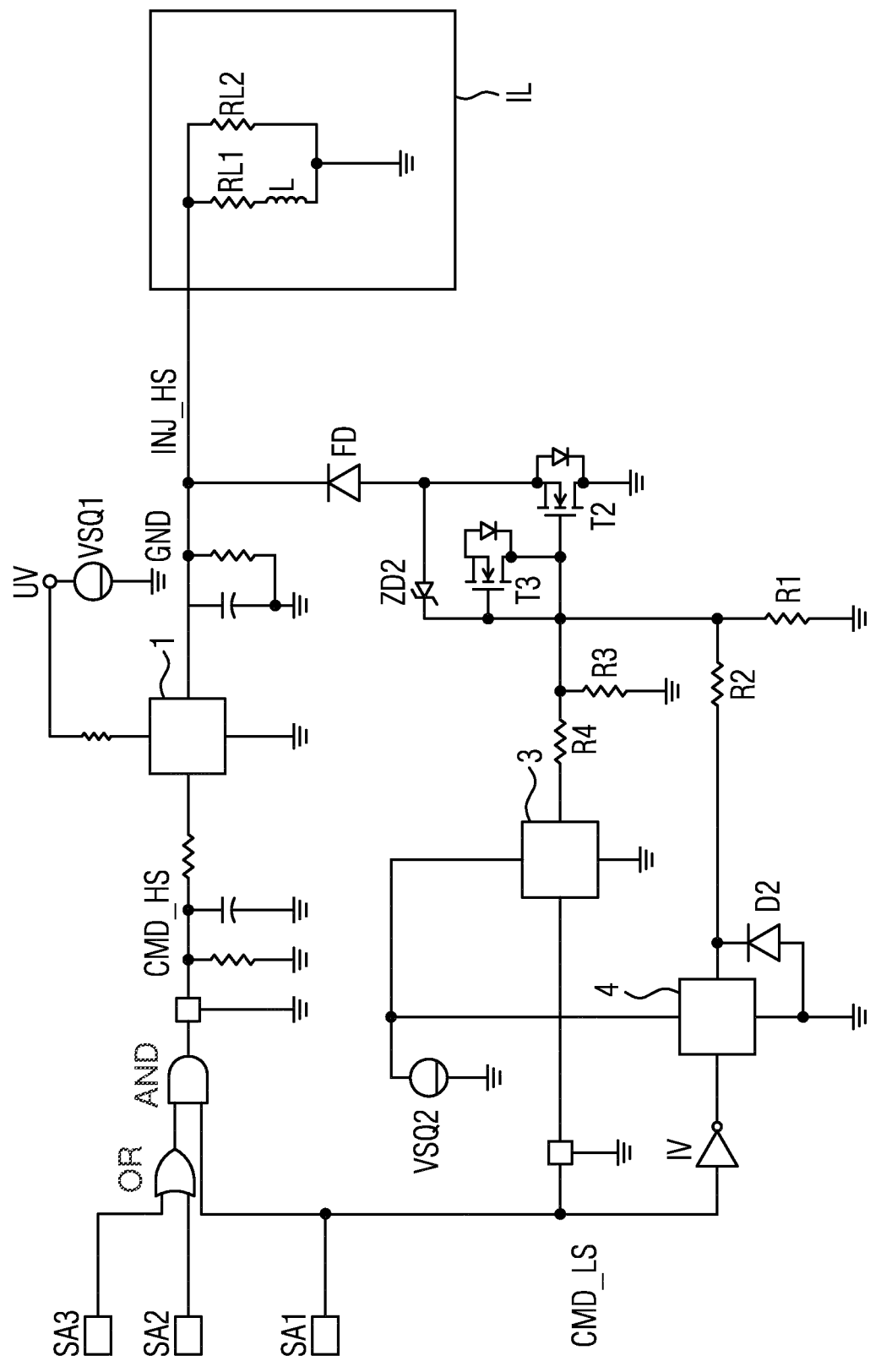
FIG. 3 shows a circuit diagram of a broadened circuit arrangement according to the invention.

FIG. 3 shows not only the circuit components of the circuit arrangement according to the invention, as are already depicted in FIG. 1, but also an advantageous form of the second power switching element 2 that allows very fast opening of the second power switching element 2.

The second power switching element 2 is in this case formed by means of a second MOS field effect transistor T2 whose terminal connected to the freewheeling diode FD is connected to the gate terminal of a third MOS field effect transistor T3 via the load path thereof. The control terminal of the third MOS field effect transistor T3 is in this case connected to the first control terminal SA1 via an inverter IV, so that the second and third MOS field effect transistors T2, T3 are each driven in the opposite sense.

Thus, when the second MOS field effect transistor T2 is turned off, the third MOS field effect transistor T3 is at the same time turned on, so that the second MOS field effect transistor T2 is quickly and reliably off.

Both the second and the third MOS field effect transistor T2, T3 have their source terminals connected to the anode of the freewheeling diode FD, as a result of which the substrate diodes thereof are connected with the opposite polarity to the freewheeling diode FD, so that this cannot result in a conductive path.

In the exemplary embodiment of FIG. 3, the first control terminal SA1 is connected to the gate terminal of the second MOS field effect transistor T2 via a first driver circuit 3 and a voltage divider R3, R4. The output of the inverter IV is connected to the gate terminal of the third MOS field effect transistor T3 via a second driver circuit 4 and a current limiting resistor R2, this gate terminal additionally being connected to the second terminal for a low potential of the first supply voltage source VSQ1 via a first resistor R1 for the purpose of safely connecting to ground.

The output of the second driver circuit 4 is connected to the second terminal for a low potential GND of the first supply voltage source VSQ1 via a second diode D2, which is reverse-biased, for the purpose of protecting against negative voltages. The gate/source junction of the third MOS field effect transistor T3 is likewise bypassed by means of a second zener diode ZD2 for the purpose of protecting against negative voltages on the gate terminal of the third MOS field effect transistor T3.

The driver circuits 3, 4 are supplied with power by a second supply voltage source VSQ2.

The invention claimed is:

1. A circuit arrangement for driving an inductive load that is connectable to a load terminal, the circuit arrangement comprising:
    a first MOS field effect transistor connected up between a first terminal for a high potential of a first supply voltage source and the load terminal;
    a series circuit having a freewheeling diode and a second MOS field effect transistor, said freewheeling diode being connected up between the load terminal and a second terminal for a low potential of the first supply voltage source, and said freewheeling diode having a cathode connected to the load terminal;
    said first MOS field effect transistor having drain and gate terminals, and a series circuit with at least one reverse-biased first zener diode and a forward-biased first diode connected up between said drain and gate terminals; and
    a first control signal terminal connected to a gate terminal of said second MOS field effect transistor and an AND circuit connected between said first control signal terminal and a gate terminal of said first MOS field effect transistor.

2. The circuit arrangement according to claim 1, wherein:
    said second MOS field effect transistor has a first load path terminal, a second load path terminal, and said gate terminal;
    said second load path terminal is connected to the terminal for the low potential of said first supply voltage source;
    said first load path terminal and said gate terminal have a load path of a third MOS field effect transistor connected there between; and
    said first control signal terminal is connected to a gate terminal of said third MOS field effect transistor via an inverter circuit.

3. The circuit arrangement according to claim 2, wherein said second MOS field effect transistor and said third MOS field effect transistor are n-MOS field effect transistors, each having a respective substrate diode and connected up such that said substrate diodes are connected up with reverse polarity in relation to said freewheeling diode.

4. The circuit arrangement according to claim 2, wherein said gate terminal of said third MOS field effect transistor is connected to the first load terminal of said second MOS field effect transistor via a reverse-biased second zener diode.

5. The circuit arrangement according to claim 2, further comprising a first driver circuit connecting said first control signal terminal to the gate terminal of said second MOS field effect transistor and a second driver circuit connecting said first control signal terminal to said third MOS field effect transistor.

6. The circuit arrangement according to claim 5, wherein the gate terminal of said third MOS field effect transistor is connected to the terminal for the low potential of said first supply voltage source via a first resistor and to an output of said second driver circuit via a second resistor.

7. The circuit arrangement according to claim 5, wherein an output of said second driver circuit is connected to the terminal for the low potential of said first supply voltage source via a reverse-biased second diode.

8. The circuit arrangement according to claim 5, wherein the gate terminal of said third MOS field effect transistor is connected to the terminal for the low potential of said first supply voltage source via a first resistor and to an output of said second driver circuit via a second resistor; and an output of said second driver circuit is connected to the terminal for the low potential of said first supply voltage source via a reverse-biased second diode.

9. The circuit arrangement according to claim 8, wherein said gate terminal of said third MOS field effect transistor is connected to the first load terminal of said second MOS field effect transistor via a reverse-biased second zener diode.

\* \* \* \* \*